(12) United States Patent
Shi et al.

(10) Patent No.: US 11,538,965 B2
(45) Date of Patent: Dec. 27, 2022

(54) LIGHT-EMITTING DIODE FILAMENT STRUCTURE AND LED LIGHTING LAMP INCLUDING THE SAME

(71) Applicant: XIAMEN SANAN OPTOELECTRONICS TECHNOLOGY CO., LTD., Xiamen (CN)

(72) Inventors: Junpeng Shi, Xiamen (CN); Zhen-Duan Lin, Xiamen (CN); Chen-Ke Hsu, Xiamen (CN); Ping Zhang, Xiamen (CN)

(73) Assignee: Xiamen Sanan Optoelectronics Technology Co., Ltd., Xiamen (CN)

( * ) Notice: Subject to any disclaimer, the term of this patent is extended or adjusted under 35 U.S.C. 154(b) by 0 days.

(21) Appl. No.: 16/948,441

(22) Filed: Sep. 18, 2020

(65) Prior Publication Data
US 2021/0005791 A1 Jan. 7, 2021

Related U.S. Application Data

(63) Continuation-in-part of application No. PCT/CN2019/072024, filed on Jan. 16, 2019.

(30) Foreign Application Priority Data

Mar. 21, 2018 (CN) .......................... 201810233531.3

(51) Int. Cl.
*H01L 33/50* (2010.01)
*H01L 25/075* (2006.01)

(52) U.S. Cl.
CPC ........ *H01L 33/504* (2013.01); *H01L 25/0753* (2013.01)

(58) Field of Classification Search
CPC ...................................... F21K 9/64; F21K 9/65
See application file for complete search history.

(56) References Cited

U.S. PATENT DOCUMENTS

| | | | | |
|---|---|---|---|---|
| 2011/0133672 | A1* | 6/2011 | Tsang | F21S 10/02 315/294 |
| 2014/0070186 | A1* | 3/2014 | Kim | H01L 51/5281 257/40 |
| 2014/0233214 | A1* | 8/2014 | Berben | H05B 33/14 362/84 |
| 2015/0062907 | A1* | 3/2015 | Ng | F21V 9/38 362/293 |
| 2016/0097494 | A1* | 4/2016 | Su | F21K 9/64 362/84 |
| 2020/0058835 | A1* | 2/2020 | Rintamaki | H01L 33/56 |

\* cited by examiner

*Primary Examiner* — Andrew J Coughlin
(74) *Attorney, Agent, or Firm* — Rosenberg, Klein & Lee

(57) ABSTRACT

A light-emitting diode (LED) filament structure includes a substrate, an LED chip unit, a first chromic layer, and a light conversion layer. The LED chip unit is disposed on the substrate, and includes first and second LED chips emitting different excitation lights. The first chromic layer covers the first and second LED chips. The light conversion layer covers the LED chip unit and the first chromic layer. The first chromic layer is configured to transition between an inactivated state and an activated state to prevent or allow the excitation light from the first or second LED chips to pass therethrough, so as to excite the light conversion layer to emit different excited lights having different color temperatures.

17 Claims, 3 Drawing Sheets

LIGHT-EMITTING DIODE FILAMENT STRUCTURE AND LED LIGHTING LAMP INCLUDING THE SAME

CROSS-REFERENCE TO RELATED APPLICATION

This application is a bypass continuation-in-part application of PCT International Application No. PCT/CN2019/072024 filed on Jan. 16, 2019, which claims priority of Chinese Invention Patent Application No. 201810233531.3 filed on Mar. 21, 2018. The entire content of each of the International and Chinese patent applications is incorporated herein by reference.

FIELD

The disclosure relates to a lighting device, and more particularly to a light-emitting diode (LED) filament structure and an LED lighting lamp.

BACKGROUND

Advancement of society and the improvement of living standard leads to an increased usage of lighting products. A conventional light-emitting diode (LED) light bulb includes a flat printed circuit board (PCB), an LED packaging structure that is disposed on the PCB, and a heat sink that is disposed on the PCB opposite to the LED packaging structure for heat dissipation. However, the conventional LED light bulb is not capable of projecting a 360-degree light. In addition, the conventional LED light bulb has inaesthetic appearance as compared with an incandescent light bulb, and a fabrication process thereof is largely different from that of the incandescent light bulb, which causes difficulty for manufacturers of the incandescent light bulb to make the LED light bulb.

In recent years, an LED filament light bulb has attracted much attention since it can project a 360-degree light and thus, is advantageous for production. However, a lighting effect of the LED filament light bulb is obviously different from that of the incandescent light bulb due to the following reasons. First, the LED filament light bulb has a filament structure which is larger than that of the incandescent light bulb. Secondly, the LED filament light bulb emits a light having yellow color or close to yellow color, which is different from that emitted from the incandescent light bulb. Thirdly, the LED filament light bulb, when powered on, emits a light having a substantially stable color temperature while the incandescent light bulb needs a predetermined time to raise the color temperature, so as to obtain light with stable brightness. Lastly, unlike the LED filament light bulb, the incandescent light bulb emits light with a low color temperature when operated at a relatively low power, and emits light with a high color temperature when operated at a relatively high power.

Therefore, there is a need to develop an LED filament structure and an LED lighting lamp that includes such structure, so as to achieve a lighting effect (such as tunable color temperature and brightness) similar to that of the incandescent light bulb.

SUMMARY

Therefore, an object of the disclosure is to provide a light-emitting diode (LED) filament structure that can alleviate or eliminate at least one of the drawbacks of the prior art.

According to the disclosure, the LED filament structure includes a substrate, an LED chip unit, a first chromic layer, and a light conversion layer.

The LED chip unit is disposed on the substrate, and includes at least one first LED chip and at least one second LED chip that are spaced apart from each other and that emit excitation lights having different emission peak wavelengths.

The first chromic layer covers one of the first LED chip and the second LED chip.

The light conversion layer is disposed on and covers the LED chip unit and the first chromic layer, and includes a light conversion material.

The first chromic layer is configured to transition between an inactivated state and an activated state.

In the inactivated state, the first chromic layer prevents the excitation light emitted from the one of the first and second LED chips from passing therethrough, and meanwhile, the excitation light emitted from the other one of the first and second LED chips passes through the light conversion layer and excites the light conversion material to emit a first excited light.

In the activated state, the first chromic layer allows the excitation light emitted from the one of the first and second LED chips to pass therethrough, and meanwhile, the excitation lights emitted from the first and second LED chips pass through the light conversion layer and excite the light conversion material to obtain a second excited light which has a color temperature different from that of the first excited light.

Another object of the disclosure is to provide an LED lighting lamp that can alleviate at least one of the drawbacks of the prior art.

According to the disclosure, the LED lighting lamp includes the LED filament structure as mentioned above.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
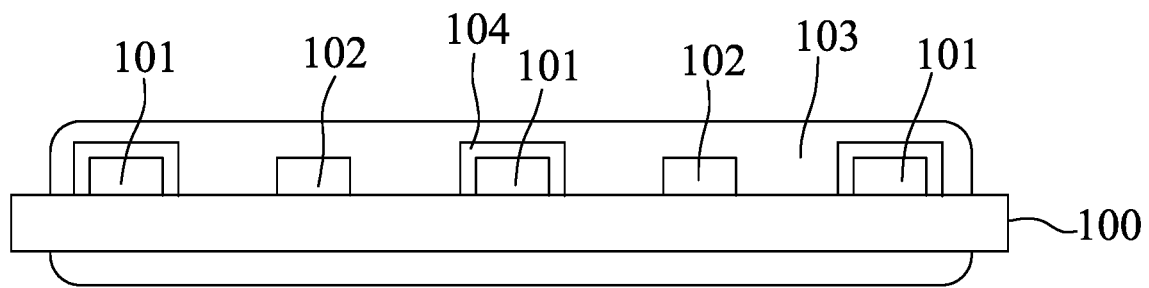
FIG. 1 is a schematic view illustrating a first embodiment of a light-emitting diode (LED) filament structure according to this disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a first embodiment of a light-emitting diode (LED) filament structure according to the present disclosure includes a substrate 100, an LED chip unit, a first chromic layer 104, and a light conversion layer 103.

The substrate 100 may be a strip-like transparent ceramic substrate, and may have a good thermal conductivity.

The LED chip unit is disposed on the substrate 100, and includes at least one first LED chip 101 and at least one second LED chip 102 that are spaced apart from each other and that emit excitation lights having different emission peak wavelengths. The number of the first and second LED chips 101, 102 are not particularly limited, and may be varied according to practical requirements.

For example, the LED chip unit may include a plurality of the first LED chips 101 and a plurality of the second LED chips 102 that are alternately disposed on the same surface of the substrate 100 and that are spaced apart from one another. In other words, the plurality of the first LED chips 101 are spaced apart from each other, the plurality of the second LED chips 102 are spaced apart from each other, and each of the first LED chips 101 and the second LED chips 102 are spaced apart from each another. In this embodiment, the first LED chips 101 are equally spaced apart from adjacent ones of the second LED chips 102 on the same surface of the substrate 100, and the first LED chips 101 and the second LED chips 101 are arranged in a single linear row arrangement so as to provide a consistent illumination, and an uniform change in color temperature and brightness of the emitted light, thereby achieving a desired visual effect. In addition, a distance between each of the first LED chips 101 and adjacent ones of the second LED chips 102 may be increased to a maximum value, so that each of the first and second LED chips 101, 102 may have more space for dissipating heat, thereby enhancing the heat dissipating effect of the LED filament structure. Moreover, the first LED chips 101 and the second LED chips 102 may be electrically interconnected through gold wires or other methods that are well known to those skilled in the art.

The first chromic layer 104 covers the first LED chips 101 or the second LED chips 102. In this embodiment, the first chromic layer 104 is disposed over each of the first LED chips 101. That is, except for the surface of each of the first LED chips 101 in contact with the substrate 100, all of the exposed surfaces of each of the first LED chips 101 are covered by the first chromic layer 104.

The light conversion layer 103 is disposed on and covers the LED chip unit and the first chromic layer 104. In this embodiment, the light conversion layer 103 further partially encapsulates the substrate 100 in such a manner that two terminal end portions of the substrate 10 are exposed therefrom. The first LED chips 101 and the second LED chips 102 are enclosed and separated from one another by the light conversion layer 103. The first chromic layer 104 is disposed between each of the first LED chips 101 and the light conversion layer 103.

The light conversion layer 103 includes a light conversion material for converting the excitation light(s) from the first LED chip 101 and/or second LED chip 102 to excited lights. The content of the light conversion material is not particularly limited, and maybe varied according to practical requirements. For example, the light conversion material may be composite phosphors (in a powder form) that includes red phosphors (e.g., $(Sr_xCa_{1-x})AlSiN_3$) and one of yellow phosphors (e.g., YAG) and green phosphors (e.g., LuAG, GaYAG, and so on). Therefore, the light conversion material can be excited by excitation lights having different wavelengths (i.e., emitted from the first and second LED chips 101, 102), so as to obtain excited lights having different color temperature, such as a red light (i.e., warm-color light) and a green light (i.e., cool-color light). Alternatively, the light conversion material may include RGB (red, green and blue) composite phosphors. By adjusting the composition of the light conversion material (i.e., the content of each type of the phosphors contained therein), the color temperature of the excited light may be varied.

The light conversion layer 103 may further include a glue body for allowing the light conversion material to uniformly bind to and surround peripheries of the first and second LED chips 101, 102. Examples of a material for making the glue body may include, but are not limited to, a silica gel, an epoxy resin, and a combination thereof. The first chromic layer 104 is configured to transition between an inactivated state and an activated state. In this embodiment, in the inactivated state, the first chromic layer 104 prevents the excitation light emitted from the first LED chips 101 (i.e. those covered by the first chromic layer 104) from passing therethrough, and meanwhile, the excitation light emitted from the second LED chips 102 (i.e., those not covered by the first chromic layer 104) passes through the light conversion layer 103 and excites the light conversion material to emit a first excited light. In the activated state, the first chromic layer 104 allows the excitation light emitted from the first LED chips 101 to pass therethrough, and meanwhile, the excitation lights emitted from the first and second LED chips 101, 102 pass through the light conversion layer 103 and excite the light conversion material to obtain a second excited light which has a color temperature different from that of the first excited light.

One of the first excited light and the second excited light may be a cool-color light, and the other one of the first excited light and the second excited light may be a warm-color light.

The first chromic layer 104 may include a photochromic material or a thermochromic material, which is capable of undergoing a reversible change in the optical properties when exposed to, e.g, light having a predetermined wavelength or heat. To be specific, in the inactivated state, the first chromic layer 104 is opaque (e.g., having a black color), so as to block light emitted from the first LED chips 101 covered by the first chromic layer 104 from passing therethrough, and in the activated state, the first chromic layer 104 changes from being opaque to being transparent due to exposure to light or heat generated from the first LED chips 101 for a predetermined time period, such that the excitation light emitted from the first LED chips 101 covered by the first chromic layer 104 is allowed to pass therethrough.

An example of the thermochromic material may be a thermochromic microcapsule that includes a leuco-dye (such as heat sensitive One Dye Black (ODB), a color developer (such as bisphenol AF (BFPA)), and a solvent for controlling temperature. The thermochromic microcapsule may be a commercial product purchased from New Prismatic Enterprise Co., Ltd., Taiwan.

Figure 4:
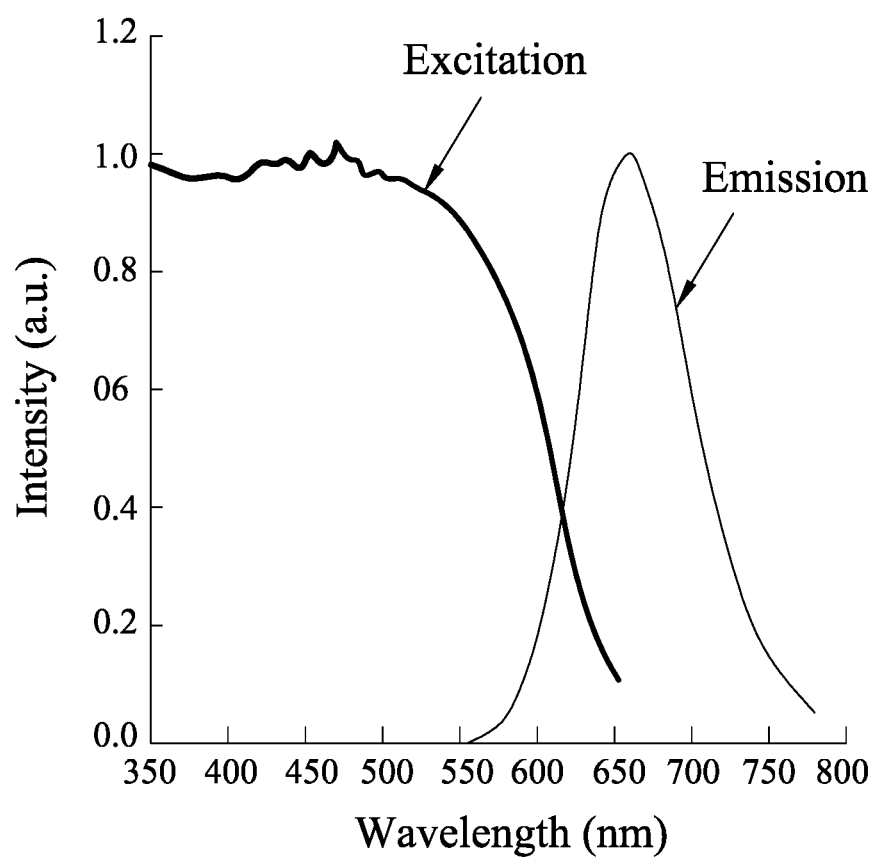
FIG. 4 is a plot showing an excitation spectrum and an emission spectrum of red phosphors.
Figure 5:
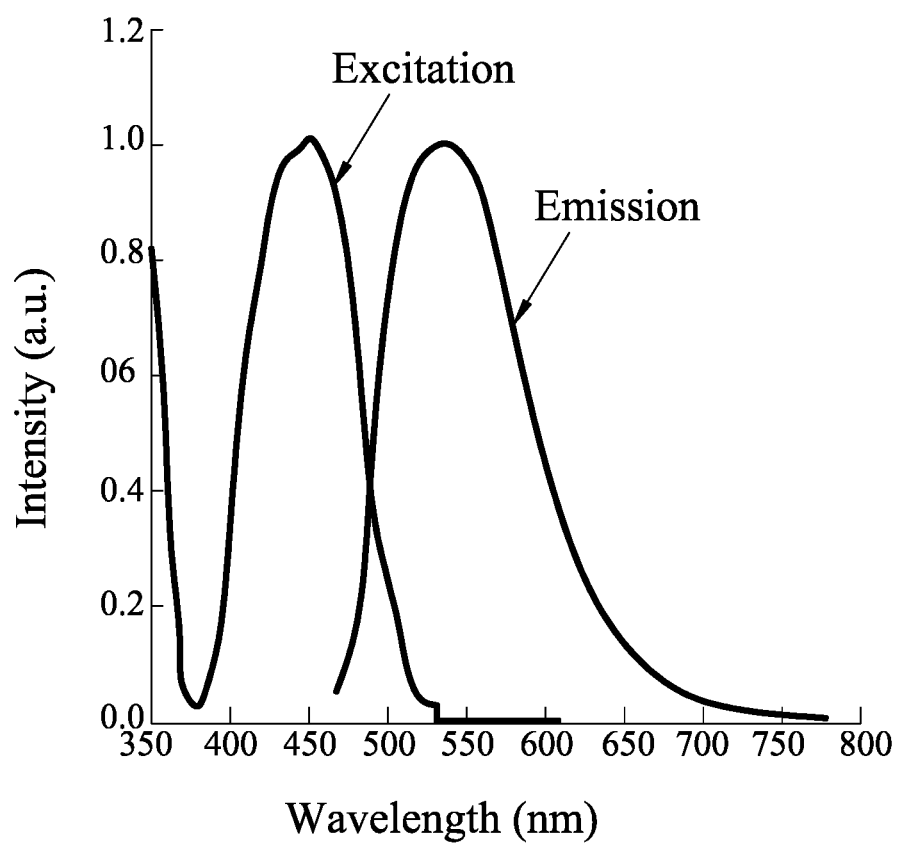
FIG. 5 is a plot showing an excitation spectrum and an emission spectrum of green phosphors.

In this embodiment, each of the first LED chips 101 emits an excitation light having an emission peak wavelength that ranges from 440 nm to 460 nm, and the excitation light emitted therefrom is capable of exciting the green phosphors of the light conversion material to emit a green light (see FIG. 5). Each of the second LED chips 102 emits an excitation light having an emission peak wavelength that ranges from 470 nm to 550 nm, and the excitation light emitted therefrom is capable of exciting the red phosphors of the light conversion material to emit a red light (see FIG. 4). Therefore, the first excited light obtained in the inactivated state (i.e., the excitation light emitted from the second LED chips 102 excites the red phosphors of the light conversion material) is a red light having a relatively low color temperature (i.e., cool-color light) since the excitation light emitted from the first LED chips 101 is blocked by the first chromic layer 104. The second excited light obtained in the activated state (i.e., the excitation lights emitted from all of the first and second LED chips 101, 102 excite the light conversion material) is a mixture of red and green lights, which has a color temperature higher than that of the first excited light (i.e., cool-color light). As such, the LED filament structure exhibits a gradually increased brightness from the inactivated state to the activated state. In a variation of the first embodiment, each of the first LED chip 101 emits the excitation light having an emission peak wavelength that ranges from 380 nm to 430 nm, and the excitation light emitted therefrom is capable of exciting the red phosphors of the light conversion material to emit a red light (see FIG. 4). The second LED chips 102 emit an excitation light having an emission peak wavelength that ranges from 440 nm to 460 nm, and the excitation light emitted therefrom is capable of exciting the green phosphors of the light conversion material to emit a green light (see FIG. 5). In other words, the first excited light obtained in the inactivated state (i.e., only the excitation light emitted from the second LED chip 102 excites the green phosphors of the light conversion material) is a green light having a relatively high color temperature (i.e., cool-color light). The second excited light obtained in the activated state (i.e., the excitation lights emitted from all of the first and second LED chips 101, 102 excite the light conversion material) is a mixture of red and green lights, which has a color temperature lower than that of the first excited light (i.e., warm-color light). In certain embodiments, in the activated state, the first chromic layer 104 has a light transmittance that increases with an increased current which is applied to the LED filament structure of the present disclosure. The time period for the first chromic layer 104 to transition from the inactivated state to the activated state may be reduced with an increased current that is applied to the LED filament structure of the present disclosure.

Specifically, when the current applied to the LED filament structure increases, the current flowing through the first and second LED chips 101, 102 would be increased, and the first and second LED chips 101, 102 can emit the excitation lights with an enhanced brightness, so that the first chromic layer 104 absorbs more light or heat energy from the excitation lights so as to undergo a more complete change in the optical properties (e.g., from being opaque to being transparent) within a short time period. As such, the LED filament structure can emit, in the activated state, the second excited light exhibiting a more significant difference (such as color temperature, brightness, etc.) as compared to the first excited light emitted in the inactivated state. The strength of the current to be applied to the LED filament structure is not particularly limited, and may be determined according to practical requirements.

Figure 2:
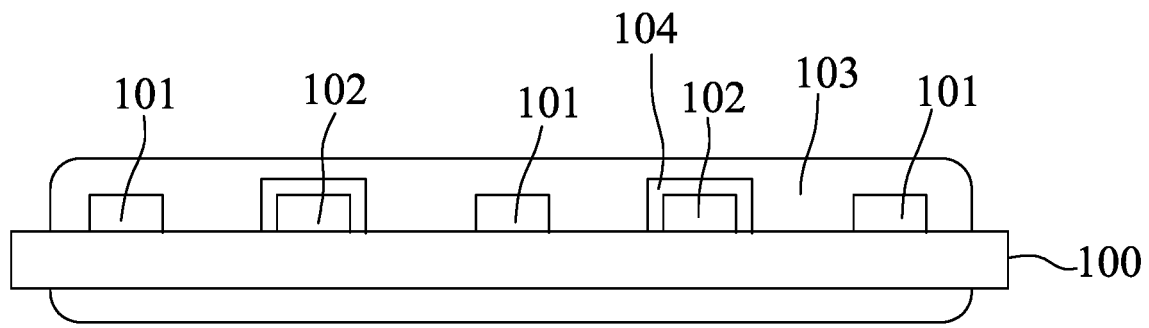
FIG. 2 is a schematic view illustrating a second embodiment of the LED filament structure according to this disclosure.

Referring to FIG. 2, a second embodiment of the LED filament structure according to the present disclosure is generally similar to the first embodiment, except that in the second embodiment, the first chromic layer 104 covers the second LED chips 102 instead of the first LED chips 101. Therefore, in the inactivated state, the first chromic layer 104 prevents the excitation light emitted from the second LED chips 102 (i.e. those covered by the first chromic layer 104) from passing therethrough, and meanwhile, the excitation light emitted from the first LED chips 101 (i.e., those not covered by the first chromic layer 104) passes through the light conversion layer 103 and excites the light conversion material to emit a first excited light. In the activated state, the first chromic layer 104 allows the excitation light emitted from the second LED chips 102 to pass therethrough, and meanwhile, the excitation lights emitted from the first and second LED chips 101, 102 pass through the light conversion layer 103 and excite the light conversion material to obtain a second excited light.

Specifically, in this embodiment, the first LED chips 101 emit an excitation light having an emission peak wavelength that ranges from 440 nm to 460 nm, and the second LED chips 102 emit an excitation light having an emission peak wavelength that ranges from 470 nm to 550 nm. In the inactivated state, since the excitation light emitted from the second LED chips 102 is blocked by the first chromic layer 104, only the excitation light emitted from the first LED chips 101 excites the green phosphors of the light conversion material, and the resultant first excited light is a green light. In the activated state, both of the excitation lights emitted from the first and second LED chips 101, 102 excite the light conversion material, and the result second excited light is a mixture of red and green lights, which has a color temperature lower than that of the first excited light.

In a variation of the second embodiment, the first LED chips 101 emit an excitation light having an emission peak wavelength that ranges from 380 nm to 430 nm, and the second LED chips 102 emit an excitation light having an emission peak wavelength that ranges from 440 nm to 460 nm. In the inactivated state, only the excitation light emitted from the first LED chips 101 excites the red phosphors of the light conversion material, and the resultant first excited light is a red light. In the activated state, both of the excitation lights emitted from the first and second LED chips 101, 102 excite the light conversion material, and the result second excited light is a mixture of red and green lights, which has a color temperature greater than that of the first excited light.

Figure 3:
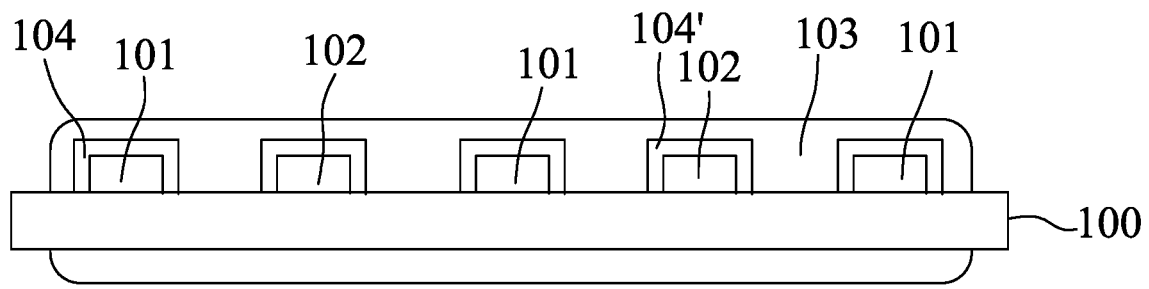
FIG. 3 is a schematic view illustrating a third embodiment of the LED filament structure according to this disclosure.

Referring to FIG. 3, a third embodiment of the LED filament structure according to the present disclosure is generally similar to the first embodiment, except that the third embodiment further includes a second chromic layer 104' that covers each of the second LED chips 102, and that allows the excitation light emitted from the second LED chips 102 to pass therethrough.

In addition, the first chromic layer 104 has an absorption peak wavelength equal to the emission peak wavelength of the excitation light emitted from the first LED chips 101. When the first chromic layer 104 is in the inactivated state, the first chromic layer 104 absorbs the excitation light emitted from the first LED chips 101 so that the excitation light emitted from the first LED chips 101 does not enter into the light conversion layer 103. When the first chromic layer 104 is in the activated state, the absorption peak wavelength of the first chromic layer 104 is changed to be different from the emission peak wavelength of the excitation light emitted from the first LED chips 101, such that the excitation light emitted from the first LED chips 101 is allowed to pass the first chromic layer 104 (i.e., not absorbed by the first chromic layer 104). For example, the change of the absorption peak wavelength of the first chromic layer 104 may be a gradual disappearance of the absorption peak wavelength or a shift (such as red-shift) of the absorption peak wavelength upon exposure to heat or light.

Specifically, in this embodiment, the excitation light emitted from the first LED chips 101 has an emission peak wavelength that ranges from 440 nm to 460 nm, which is equal to the absorption peak wavelength of the first chromic layer 104. The second LED chips 102 emit an excitation light having an emission peak wavelength that ranges from 470 nm to 550 nm. Therefore, in the inactivated state, only the excitation light emitted from the second LED chips 102 passes through the second chromic layer 104' and excites the red phosphors of the light conversion material, and the resultant first excited light is a red light since the excitation light emitted from the first LED chips 101 is absorbed by the the first chromic layer 104. In the activated state, the excitation lights emitted from the first and second LED chips 101, 102 respectively pass through the first and second chromic layers 104, 104' and excite the light conversion material, and the result second excited light is a mixture of red and green lights, which has a color temperature greater than that of the first excited light.

In a first variation of the third embodiment, the excitation light emitted from the first LED chips 101 has an emission peak wavelength that ranges from 380 nm to 430 nm, which is equal to the absorption peak wavelength of the first chromic layer 104. The second LED chips 102 emit an excitation light having an emission peak wavelength that ranges from 440 nm to 460 nm. Therefore, in the inactivated state, only the excitation light emitted from the second LED chips 102 excites the green phosphors of the light conversion material, and the resultant excited light is a green light. In the activated state, both of the excitation lights emitted from the first and second LED chips 101, 102 excite the light conversion material, and the resultant second excited light is a mixture of red and green lights, which has a color temperature lower than that of the first excited light.

In a second variation of the third embodiment, the second LED chips 102 emit an excitation light having an emission peak wavelength that ranges from 440 nm to 460 nm. The excitation light emitted from the first LED chips 101 has an emission peak wavelength that ranges from 470 nm to 550 nm, which is equal to the absorption peak wavelength of the first chromic layer 104. Therefore, in the inactivated state, only the excitation light emitted from the second LED chips 102 excites the green phosphors of the light conversion material, and the resultant first excited light is a green light. In the activated state, both of the excitation lights emitted from the first and second LED chips 101, 102 excite the light conversion material, and the resultant second excited light is a mixture of red and green lights, which has a color temperature lower than that of the first excited light.

In a third variation of the third embodiment, the second LED chips 102 emit an excitation light having an emission peak wavelength that ranges from 380 nm to 430 nm. The excitation light emitted from the first LED chips 101 has an emission peak wavelength that ranges from 440 nm to 460 nm, which is equal to the absorption peak wavelength of the first chromic layer 104. Therefore, in the inactivated state, only the excitation light emitted from the second LED chips 102 excites the red phosphors of the light conversion material, and the resultant first excited light is a red light. In the activated state, both of the excitation lights emitted from the first and second LED chips 101, 102 excite the light conversion material, and the resultant second excited light is a mixture of red and green lights, which has a color temperature greater than that of the first excited light.

This disclosure also provides an LED lighting lamp including the abovementioned LED filament structure. Since the LED filament structure can emit, in the activated state, the second excited light having a color temperature and/or the brightness different from those of the first excited light emitted in the inactivated state (e.g., from the warm-color light to the cool-color light, or vice versa), the LED lighting lamp of this disclosure may be adapted for use in a lighting lamp that exudes vintage feeling. The variation of color tone and color temperature of the first and second emitted lights may be modified according to practical requirements. In addition, the amount of the LED filament structures and a method for mounting the same can also be selected according to practical requirements.

In summary, by virtue of the first chromic layer 104 that covers one of the first and second LED chips 101, 102 that emit excitation lights having different emission peak wavelengths, and that is configured to transition between the inactivated state and the activated state to respectfully prevent and allow the excitation light emitted from the one of the first and second LED chips 101, 102 to pass therethrough, the LED filament structure and the LED lighting lamp of this disclosure are capable of emitting excited lights which exhibits variable color temperature and brightness, thereby achieving a lighting effect similar to that of the incandescent light bulb. In addition, the manufacturing process for making the LED filament structure and the LED lighting lamp of this disclosure is relatively simple and similar to that of the incandescent light bulb, and thus, is advantageous for mass production.

In the description above, for the purposes of explanation, numerous specific details have been set forth in order to provide a thorough understanding of the embodiments. It will be apparent, however, to one skilled in the art, that one or more other embodiments may be practiced without some of these specific details.

It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting diode (LED) filament structure, comprising:
    a substrate;
    an LED chip unit disposed on said substrate and including at least one first LED chip and at least one second LED chip spaced apart from each other, said at least one first and at least one second LED chips emit respective excitation lights having different emission peak wavelengths, wherein each of said at least one first and second LED chips has an exposed surface devoid of a contact with said substrate;
    a first chromic layer covering said exposed surface of one of said at least one first LED chip and said at least one second LED chip and being in direct contact therewith; and
    a light conversion layer disposed on and covering said LED chip unit and said first chromic layer, said light conversion layer including a light conversion material, wherein said first chromic layer is configured to transition between an inactivated state and an activated state;

wherein, in the inactivated state, said first chromic layer prevents the excitation light emitted from said one of said at least one first and second LED chips from passing therethrough, and the excitation light emitted from the other one of said at least one first and second LED chips passes through said light conversion layer and excites said light conversion material to emit a first excited light, and in the activated state, said first chromic layer allows the excitation light emitted from said one of said at least one first and second LED chips to pass therethrough, and the excitation lights emitted from said at least one first and second LED chips pass through said light conversion layer and excite said light conversion material to obtain a second excited light having a color temperature different from that of said first excited light.

2. The LED filament structure of claim 1, wherein in the inactivated state, said first chromic layer is opaque, and in the activated state, said first chromic layer changes from being opaque to being transparent.

3. The LED filament structure of claim 1, further comprising a second chromic layer that covers the other one of said first and second LED chips, and that allows the excitation light emitted from said the other one of said first and second LED chips to pass therethrough.

4. The LED filament structure of claim 3, wherein:
said first chromic layer has an absorption peak wavelength equal to the emission peak wavelength of the excitation light emitted from said one of said first and second LED chips,
when said first chromic layer is in the inactivated state, said first chromic layer absorbs the excitation light emitted from said one of said first and second LED chips so that the excitation light emitted from said one of said first and second LED chips does not enter into said light conversion layer, and
when said first chromic layer is in the activated state, the absorption peak wavelength of said first chromic layer is changed to be different from the emission peak wavelength of the excitation light emitted from said one of said first and second LED chips, such that the excitation light emitted from said one of said first and second LED chips is allowed to pass therethrough.

5. The LED filament structure of claim 1, wherein said first LED chip emits an excitation light having an emission peak wavelength that ranges from 440 nm to 460 nm and is covered by said first chromic layer, said second LED chip emits an excitation light having an emission peak wavelength that ranges from 470 nm to 550 nm, and the color temperature of said second excited light is greater than that of said first excited light.

6. The LED filament structure of claim 1, wherein said first LED chip emits an excitation light having an emission peak wavelength that ranges from 440 nm to 460 nm, and said second LED chip emits an excitation light having an emission peak wavelength that ranges from 470 nm to 550 nm and is covered by said first chromic layer, and the color temperature of said second excited light is lower than that of said first excited light.

7. The LED filament structure of claim 1, wherein said first LED chip emits an excitation light having an emission peak wavelength that ranges from 380 nm to 430 nm and is covered by said first chromic layer, said second LED chip emits an excitation light having an emission peak wavelength that ranges from 440 nm to 460 nm, and the color temperature of said second excited light is lower than that of said first excited light.

8. The LED filament structure of claim 1, wherein said first LED chip emits an excitation light having an emission peak wavelength that ranges from 380 nm to 430 nm, said second LED chip emits an excitation light having an emission peak wavelength that ranges from 440 nm to 460 nm and is covered by said first chromic layer, and the color temperature of said second excited light is greater than that of said first excited light.

9. The LED filament structure of claim 1, wherein when transitioning from the inactivated state to the activated state, said first chromic layer has a light transmittance that increases with an increased current applied to said LED filament structure.

10. The LED filament structure of claim 9, wherein the time period for said first chromic layer to transition from the inactivated state to the activated state is reduced with the increased current that is applied to said LED filament structure.

11. The LED filament structure of claim 1, wherein said LED chip unit includes a plurality of said first LED chips and a plurality of said second LED chips that are alternately disposed on the same surface of said substrate and that are spaced apart from one another.

12. The LED filament structure of claim 11, wherein said first LED chips are equally spaced apart from adjacent ones of said second LED chips.

13. The LED filament structure of claim 1, wherein said light conversion layer further includes a glue body that is made of a material selected from the group consisting of a silica gel, an epoxy resin, and a combination thereof.

14. The LED filament structure of claim 13, wherein said light conversion material includes red phosphors, and one of green phosphors, yellow phosphors and a combination thereof.

15. The LED filament structure of claim 1, wherein said first chromic layer includes one of a photochromic material and a thermochromic material.

16. The LED filament structure of claim 1, wherein one of said first excited light and said second excited light is a cool-color light, and the other one of said first excited light and said second excited light is a warm-color light.

17. An LED lighting lamp with an LED filament structure, said LED filament structure comprising:
a substrate;
an LED chip unit disposed on said substrate, and including at least one first LED chip and at least one second LED chip, said at least one first and second LED chips being spaced apart from each other and emit first and second excitation lights, respectively, having different emission peak wavelengths, wherein each of said at least one first and second LED chips has an exposed surface devoid of a contact with said substrate;
a first chromic layer covering said exposed surfaces of one of said at least one first LED chip and said at least one second LED chip and being in direct contact therewith; and
a light conversion layer disposed on and covering said LED chip unit and said first chromic layer, said light conversion layer including a light conversion material,
wherein said first chromic layer is configured to transition between an inactivated state and an activated state; and
wherein, in the inactivated state, said first chromic layer prevents the excitation light emitted from said one of said at least one first and said at least one second LED chips from passing therethrough, and the excitation light emitted from the other one of said at least one first and said at least one second LED chips passes through said light conversion layer and excites said light conversion material to emit a first excited light, and in the activated state, said first chromic layer allows the excitation light emitted from said one of said at least one first and said at least one second LED chips to pass therethrough, and the excitation lights emitted from said at least one first and said at least one second LED chips passes through said light conversion layer and excites said light conversion material to obtain a second excited light having a color temperature different from that of said first excited light.

* * * * *